United States Patent [19]

Han

[11] Patent Number: 5,648,922
[45] Date of Patent: Jul. 15, 1997

[54] DIGITAL FILTER

[75] Inventor: Dong Hwan Han, Seoul, Rep. of Korea

[73] Assignee: LG Semicon Co., Ltd., Cheongju, Rep. of Korea

[21] Appl. No.: 422,413

[22] Filed: Apr. 14, 1995

[30] Foreign Application Priority Data

Apr. 14, 1994 [KR] Rep. of Korea .................. 7862/1994

[51] Int. Cl.$^6$ ............................................. G06F 17/10
[52] U.S. Cl. ........................ 364/724.12; 364/724.011
[58] Field of Search .................. 364/724.01, 724.16, 364/724.17, 724.19, 724.12

[56] References Cited

U.S. PATENT DOCUMENTS

| | | | |
|---|---|---|---|
| 4,727,505 | 2/1988 | Konishi et al. | 364/728.01 |
| 4,896,285 | 1/1990 | Ishikawa et al. | 364/724.01 |
| 5,018,090 | 5/1991 | Shiratsuchi | 364/723 |
| 5,471,411 | 11/1995 | Adams et al. | 364/724.01 |
| 5,515,402 | 5/1996 | Chester | 375/350 |
| 5,592,403 | 1/1997 | Trager et al. | 364/724.01 |

OTHER PUBLICATIONS

"A CMOS Stereo 16–Bit D/A Converter For Digital Audio", Peter J. A. Naus et al., IEEE Journal fo Solid–State Circuits, vol. SC–22, No. 3, Jun. 1987.

FIR Filtering Using Vector Transformation and Convolution Processor, Li, IEEE International Symposium on Circuits and Systems, pp. 1223–1226 1990.

*Primary Examiner*—Reba I. Elmore
*Assistant Examiner*—Robert J. Dolan
*Attorney, Agent, or Firm*—Fleshner & Kim

[57] ABSTRACT

An improved digital filter capable of advantageously completing a filter operation through a convolution using a filter coefficient used in each stage of multi-stage digital filters and previously stored in a ROM, which includes a control unit for outputting a control signal; an input buffer for buffering a data inputted in accordance with the control signal and for outputting the buffered data; a data storing unit for storing a data outputted from the input buffer in accordance with a control signal applied thereto; a ROM for storing a filter coefficient obtained through an operation of the filter coefficient of a multi-stage; an addressing unit for addressing an address of the filter coefficient stored in the ROM; and a multiplying and accumulating unit for convoluting the data outputted from the data storing unit and the ROM.

3 Claims, 4 Drawing Sheets

5,648,922

DIGITAL FILTER

BACKGROUND OF THE INVENTION

1. Field of the Invention

The present invention relates to a digital filter, and particularly, to an improved digital filter capable of advantageously completing a filter operation through a convolution using a filter coefficient used in each stage of multi-stage digital filters and previously stored in a ROM (Read Only Memory).

2. Description of the Conventional Art

Conventionally, as shown in FIG. 1, a multi-stage digital filter, such as a two-stage digital filter, includes a control unit 10 for controlling a filtering operation, an input buffer 20 for buffering a digital data inputted thereto, a first stage filter 30 for filtering a data outputted from the input buffer 20, and a second stage filter 40 for filtering a data outputted from the first stage filter 30.

The first stage filter 30 includes a RAM (Random Access Memory) 31 for storing a data outputted from the input buffer 20, a ROM 33 for storing a coefficient of the first stage filter 30, an addressing unit 32 for addressing a filter coefficient stored in the ROM 33, and a multiplying and accumulating unit 44 each for convoluting the data outputted from the RAM 31 and the ROM 33.

The second stage filter 40 is directed to receive a data outputted from the first stage filter 30 and to receive a control signal of the control unit 10 and has the same construction as in the first stage filter 30 that is, a RAM 41, an addressing unit 42, a ROM 43, and a multiplying and accumulating unit 44.

The operation of the conventional two stage digital filter will now be described.

To begin with, the control unit 10 controls the first stage filter 30 to be active when the second stage filter 40 is not active and controls the first stage filter 30 not to be active when the second stage 40 is active.

In addition, when a digital data is inputted to the input buffer 20, the input buffer 20 outputs the data inputted thereto to the RAM 31 in accordance with a control signal of the control unit 10. The RAM 31 stores the data inputted thereto in accordance with the control signal and outputs the stored data to the multiplying and accumulating unit 34. At this time, the addressing unit 32 outputs an address of a corresponding filter coefficient to the ROM 33, and the ROM 33 outputs the address of the corresponding filter coefficient to the multiplying and accumulating unit 34. Thereafter, the multiplying and accumulating unit 34 multiplies the data each outputted from the RAM 31 and the ROM 33, accumulates the multiplied data and then outputs the accumulated data to the second stage filter 40.

Thereafter, the second stage filter 40 performs the same operation as the first stage filter 30.

However, the conventional two stage digital filter requires twice the occupying volume of a single stage digital filter when performing two convolutions. In addition, when a feed back section is adapted to reduce the occupying volume, the filtering speed becomes slow because the control operation is performed through more complicated methods, and because a time sharing is required at the time of the operation of each element.

In addition, when the two stage digital filter is activated as a low pass filter LPF or a high pass filter, the filter coefficient of each stage may be combined. However, a two stage digital filter is activated as an interpolation filter, in which a sampling ratio of an output data varies, and a filter coefficient of each stage may not be combined to one coefficient using a conventional convolution because a corresponding hardware related to a varied sampling ratio is provided between the first and second stage filters.

SUMMARY OF THE INVENTION

Accordingly, it is an object of the present invention to provide a digital filter, which overcomes problems encountered in a conventional digital filter.

It is another object of the present invention to provide an improved digital filter capable of advantageously completing the operation of a filter through a convolution using a filter coefficient used in each stage of multi-stage digital filters and previously stored in a ROM.

To achieve the above objects, there is provided a digital filter, which includes a control unit for outputting a control signal; an input buffer for buffering a data inputted in accordance with the control signal and for outputting the buffered data; a data storing unit for storing a data outputted from the input buffer in accordance with a control signal applied thereto; a ROM for storing a filter coefficient obtained through an operation of the filter coefficient of a multi-stage digital filter; an addressing unit for addressing an address of the filter coefficient stored in the ROM; and a multiplying and accumulating unit for convoluting the data outputted from the data storing unit and the ROM.

DETAILED DESCRIPTION OF THE INVENTION

Figure 1:
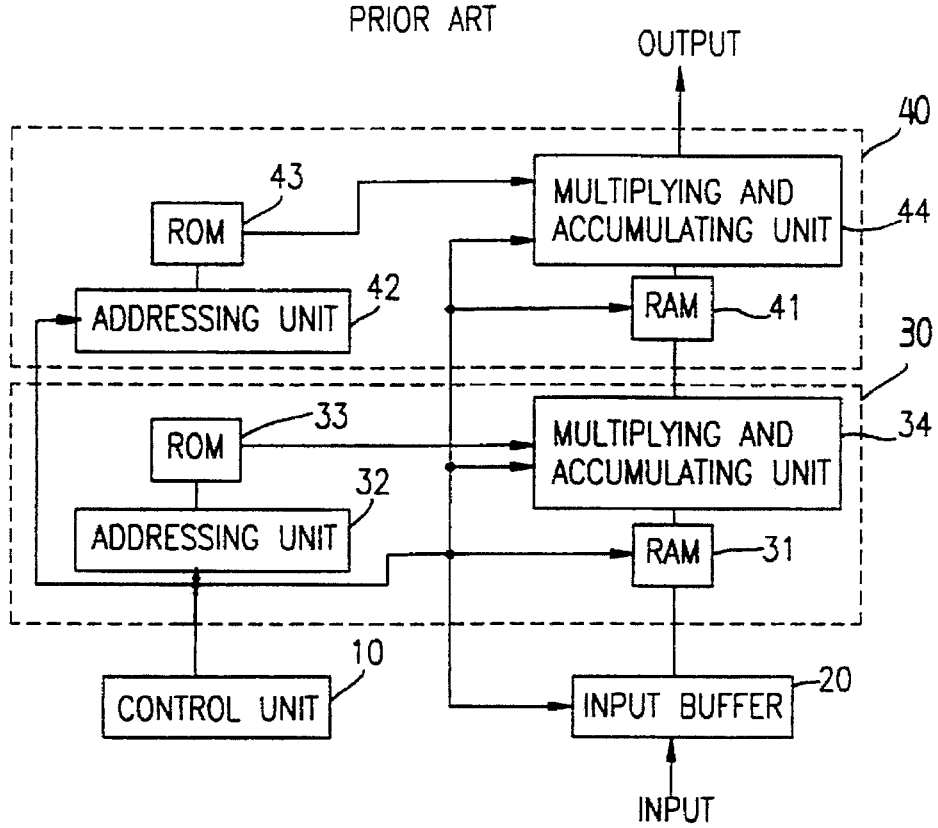
FIG. 1 is a schematic diagram of a conventional two stage digital filter.
Figure 2:
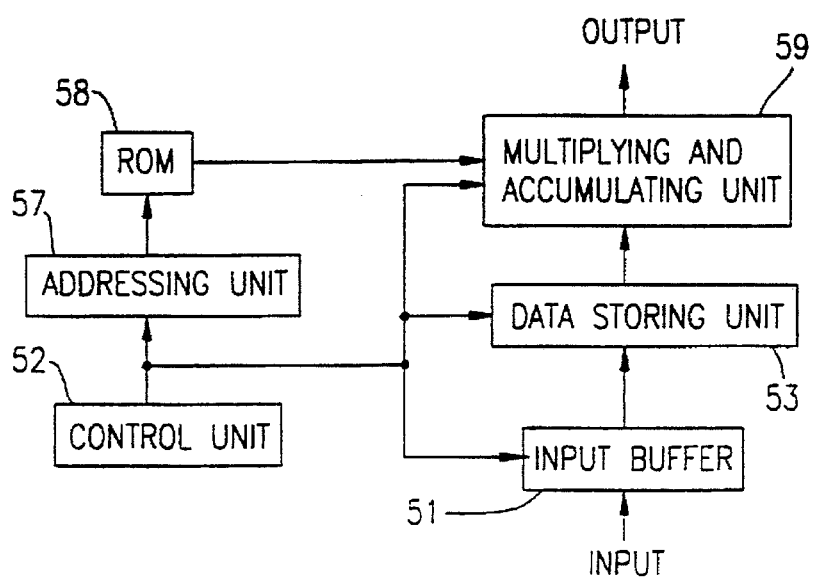
FIG. 2 is a schematic diagram of a digital filter according to the present invention.

Referring to FIG. 2, a two stage digital filter includes a control unit 52 for controlling an operation of a filter, an input buffer 51 for buffering a data inputted thereto, a storing unit 53 for storing the data outputted from the input buffer 20, a ROM 58 for storing a previously computed filter coefficient, an addressing unit 57 for addressing an address of a filter coefficient stored in the ROM 58, and a multiplying and accumulating unit 59 for convoluting each data outputted from the data storing unit 53 and the ROM 58.

Figure 3:
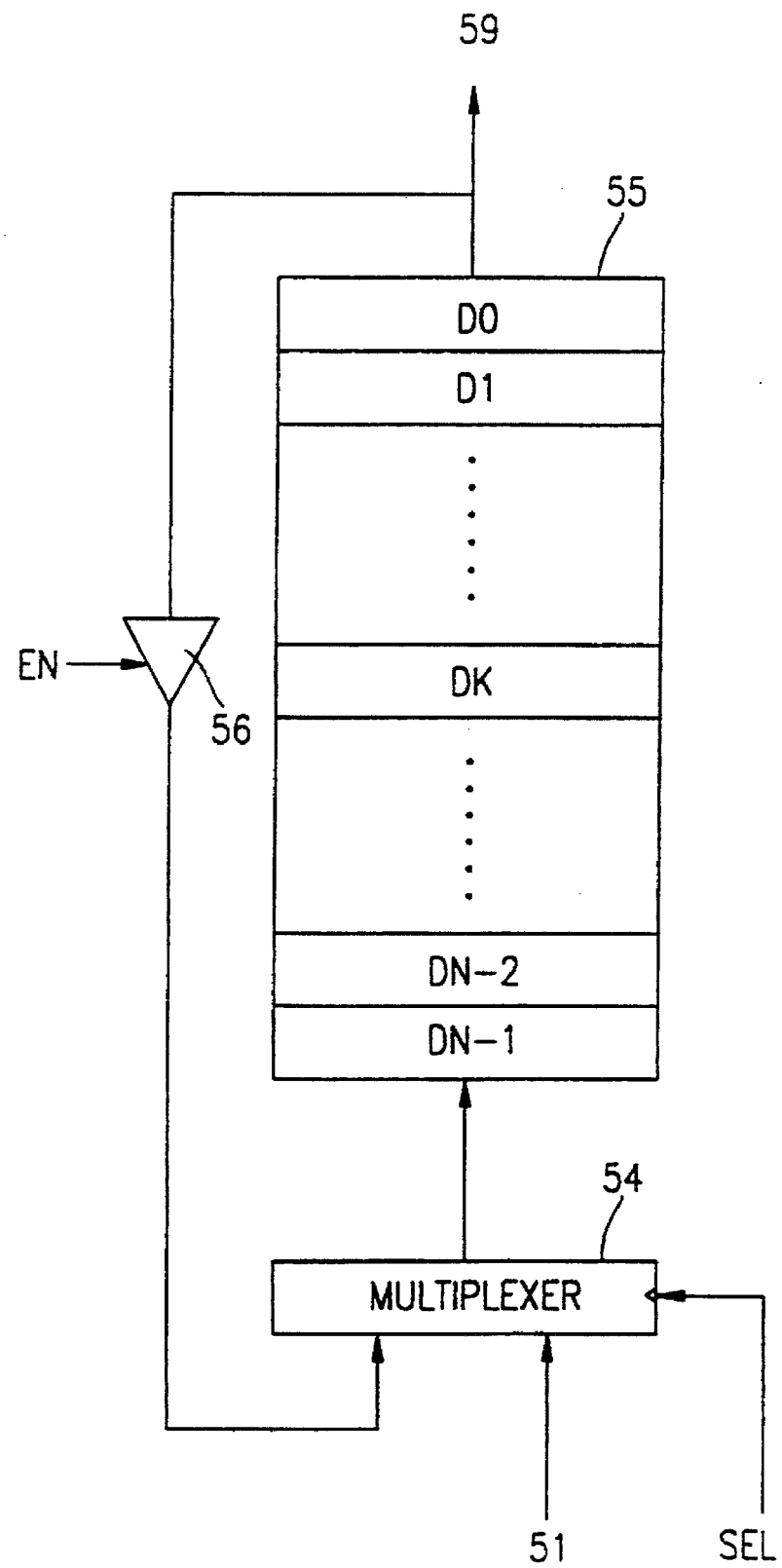
FIG. 3 is a schematic diagram of a data storing unit of FIG. 2 according to the present invention.

Referring to FIG. 3, the data storing unit 53 includes a multiplexer 54 for selecting a data outputted from the input buffer 51 and a feed-back data in accordance with a selection SEL outputted from the control unit 52, a RAM 55 for storing the data outputted from the multiplexer 54, and a buffer 56 for buffering the data $D_0-D_{n-1}$ outputted from the RAM 55. The buffer 56 outputs the buffered data to the multiplexer 54.

In a conventional two-stage digital filter, the data inputted thereto is up-sampled eight times to perform an interpolation. The input data of the first stage filter 30 is up-sampled twice using a group of coefficients stored in the ROM 33. Thereafter, the output of the first stage filter 30 is up-sampled four times using four groups of filter coefficients stored in ROM 43 of the second stage filter 40. Hence, the original input data is sampled eight times in a conventional two stage digital filter.

Unlike the conventional art, the digital filter in accordance with the present invention can perform such up-sampling without multiple stages, as shown in FIG. 2, to implement a multi-stage filter due to previously determined filter coefficients stored in the ROM 58. The filter coefficient of the present invention is determined based on a novel rearrangement of the multi-stage filter coefficients. For example, to determine the coefficients to be stored in the ROM 58 of the present invention for implementing a two stage filter, a group of the filter coefficient used in the first stage is defined as C1, groups of filter coefficients used in the second stage are defined as C2, C3, and C4. For example, if C1 consists of twenty four coefficients, and C2 and C3 each consist of six coefficients, the data ID stored in the coefficient group to the RAM 55, the output data OD1 and OD2 of the first stage, and the output data OD3 and OD4 of the second stage can be expressed as the matrixes below.

$$C1 = (A_1\ A_2\ A_3\ A_4 \text{ --------- } A_{23}\ A_{24}),$$
$$C2 = (B_1\ B_2\ B_3 \text{ ------------ } B_6),$$
$$C3 = (B_7\ B_8\ B_9 \text{ ------------ } B_{12}),$$
$$C4 = (B_{13}\ B_{14}\ B_{15} \text{ ----------- } B_{18}),$$

$$ID = \begin{pmatrix} D_{k-11} \\ D_{k-10} \\ D_{k-9} \\ . \\ D_k \\ . \\ D_{k+11} \\ D_{k+12} \end{pmatrix}$$

$$OD1 = \begin{pmatrix} O_{k-3} \\ O_{k-2} \\ O_{k-2'} \\ O_{k-1} \\ O_{k-1'} \\ O_k \end{pmatrix}$$

$$OD2 = \begin{pmatrix} O_{k-2} \\ O_{k-2'} \\ O_{k-1} \\ O_{k-1'} \\ O_k \\ O_{k'} \end{pmatrix}$$

$$OD3 = \begin{pmatrix} \Theta_1 \\ \Theta_2 \\ \Theta_3 \\ \Theta_4 \end{pmatrix}$$

$$OD4 = \begin{pmatrix} \Theta_5 \\ \Theta_6 \\ \Theta_7 \\ \Theta_8 \end{pmatrix}$$

Here, the output data $O_k$ and $O_{k'}$ of the first stage for a specific data $D_k$ can be expressed as follows.

$$O_k = Y \times ID \text{ ----- } (1)$$
$$Y = (0 \quad 0 \quad 0 \text{ --- } 0 \ 1 \ 0 \text{ --- } 0 \quad 0 \quad 0)$$
$$\quad |\leftarrow \text{eleven digits} \rightarrow | \quad |\leftarrow \text{twelve digits} \leftarrow |$$
$$O_{k'} = C1 \times ID \text{ --- } (2)$$

When the expression (1) is adapted to the output data OD1 of the first stage, the result is as follows.

$$\begin{pmatrix} O_{k-3} \\ O_{k-2} \\ O_{k-2'} \\ O_{k-1} \\ O_{k-1'} \\ O_k \end{pmatrix} = \begin{pmatrix} C_1 & 0 & 0 & 0 \\ 0 & Y & 0 & 0 \\ 0 & C_1 & 0 & 0 \\ 0 & 0 & Y & 0 \\ 0 & 0 & C_1 & 0 \\ 0 & 0 & 0 & Y \end{pmatrix} \begin{pmatrix} D_{k-14} \\ D_{k-13} \\ . \\ D_k \\ . \\ D_{k+12} \end{pmatrix}$$
$$\quad OD1 \qquad\qquad MAT\ B \qquad\qquad ID'$$

In addition, when the expression (1) is adapted to the output data OD2 of the first stage, the result is as follows.

$$\begin{pmatrix} O_{k-2} \\ O_{k-2'} \\ O_{k-1} \\ O_{k-1'} \\ O_k \\ O_{k'} \end{pmatrix} = \begin{pmatrix} 0 & Y & 0 & 0 \\ 0 & C_1 & 0 & 0 \\ 0 & 0 & Y & 0 \\ 0 & 0 & C_1 & 0 \\ 0 & 0 & 0 & Y \\ 0 & 0 & 0 & C_1 \end{pmatrix} \begin{pmatrix} D_{k-14} \\ D_{k-13} \\ . \\ D_k \\ . \\ D_{k+12} \end{pmatrix}$$
$$\quad OD2 \qquad\qquad MAT\ C \qquad\qquad ID'$$

Here, the data $D_{k-14}$, $D_{k-13}$, $D_{k-12}$ of the matrix ID' are the zero data adapted to the data ID.

In addition, the output data OD3 and OD4 of the second stage can be expressed as follows.

$$\begin{pmatrix} \Theta_1 \\ \Theta_2 \\ \Theta_3 \\ \Theta_4 \end{pmatrix} = \begin{pmatrix} 001000 \\ C2 \\ C3 \\ C4 \end{pmatrix} \begin{pmatrix} O_{k-3} \\ O_{k-2'} \\ O_{k-2} \\ O_{k-1'} \\ O_{k-1} \\ O_k \end{pmatrix}$$
$$\quad OD3 \qquad MAT\ A$$

$$\begin{pmatrix} \Theta_5 \\ \Theta_6 \\ \Theta_7 \\ \Theta_8 \end{pmatrix} = \begin{pmatrix} 001000 \\ C2 \\ C3 \\ C4 \end{pmatrix} \begin{pmatrix} O_{k-3} \\ O_{k-2'} \\ O_{k-2} \\ O_{k-1'} \\ O_{k-1} \\ O_{k'} \\ O_k \end{pmatrix}$$
$$\quad OD4 \qquad MAT\ A$$

As shown through the above expressions, the data ID passed each stage are up-sampled eight times with the remaining $O_k, \Theta_2, \Theta_3, \Theta_4, \Theta_6, \Theta_7, \Theta_8$ except for $O_k, \Theta_1, \Theta_5$ being the resultant values obtained through the convolution of the data ID and the filter coefficients C1 through C4.

Hence, the filter coefficients computed through MAT A×MAT B and MAT A×MAT C are stored in the ROM 58. Here, the method of operating the filter coefficients described above can be adapted to the multi-stage digital filter having more than the second stage.

Figure 4A:
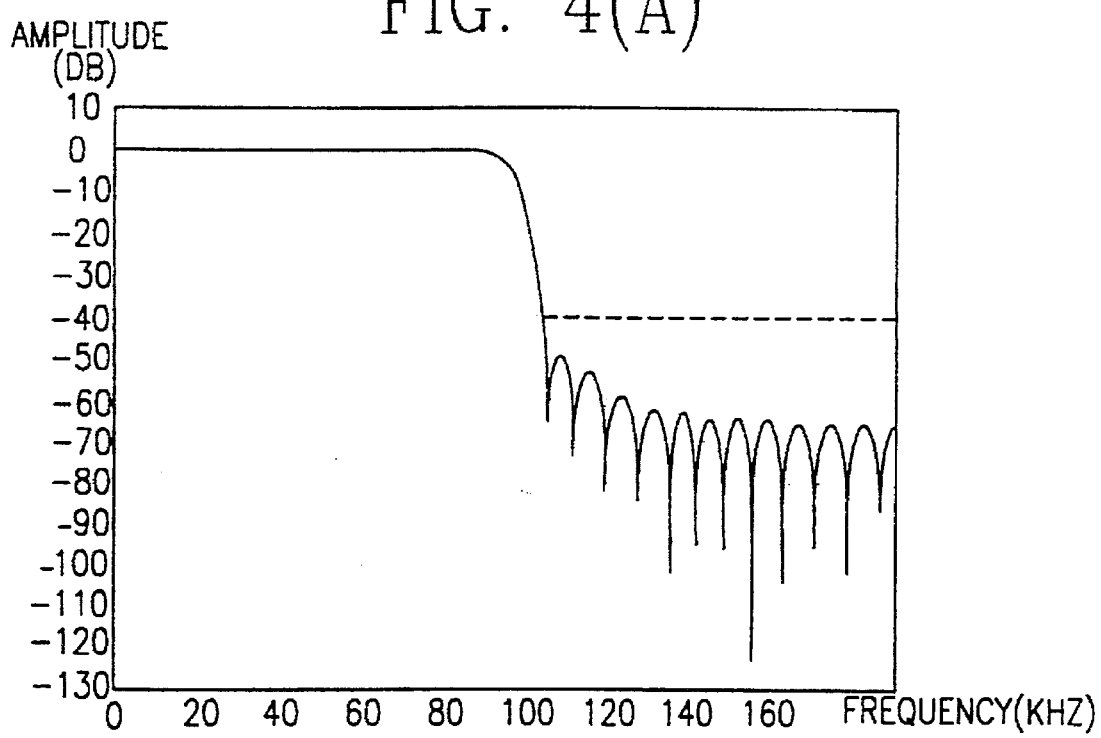
FIG. 4A is a characteristic graph of a two-fold interpolation filter according to the present invention.
Figure 4B:
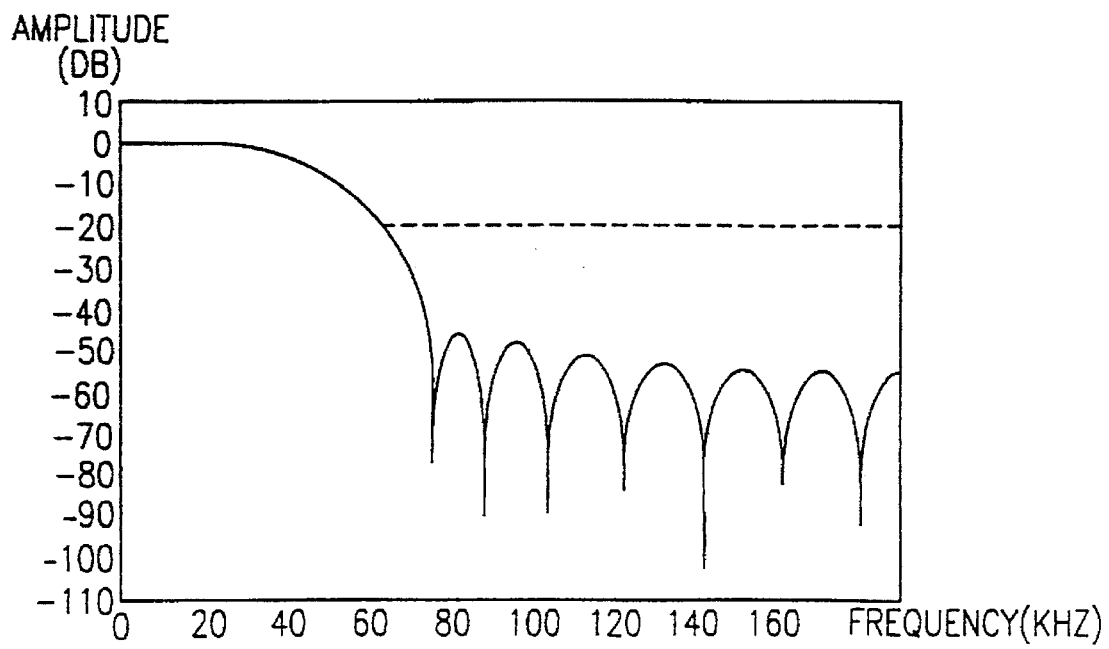
FIG. 4B is a characteristic graph of a four-fold interpolation filter according to the present invention.

Here, when the number of the filter coefficient stored in the ROM 58 is 20, and when the data is up-sampled two times, the cut-off frequency of 100 Khz is obtained as shown in FIG. 4A. In addition, when the number of the filter coefficient is 50, and when the data is up-sampled four times, the cut-off frequency of 60 Khz is obtained as shown in FIG. 4B. When the number of the filter coefficient exceeds 230, and the data is up-sampled eight times, the cut-off frequency of 20 Khz is obtained as shown in FIG. 4C.

Meanwhile, the data ID is inputted into the data storing unit 53 through the input buffer 51, the data ID is stored in the RAM 55 through the multiplexer 54 in accordance with the selection signal SEL. The data ID stored in the RAM 55 is outputted to the multiplying and accumulating unit 59, and inputted into the multiplexer 54 through the buffer 56 in accordance with the enable signal EN. Hence, the data is fed-back to the RAM 55 in accordance with the selection signal SEL to perform the convolution, and the buffer is activated by the enable signal EN until the convolution is completed.

At this time, the addressing unit 57 addresses the address of the filter coefficient stored in the ROM 58 in accordance with a control signal of the control unit 52. And then, the addressed filter coefficient is outputted to the multiplying and accumulating unit 59 and is convoluted with the data ID.

Figure 4C:
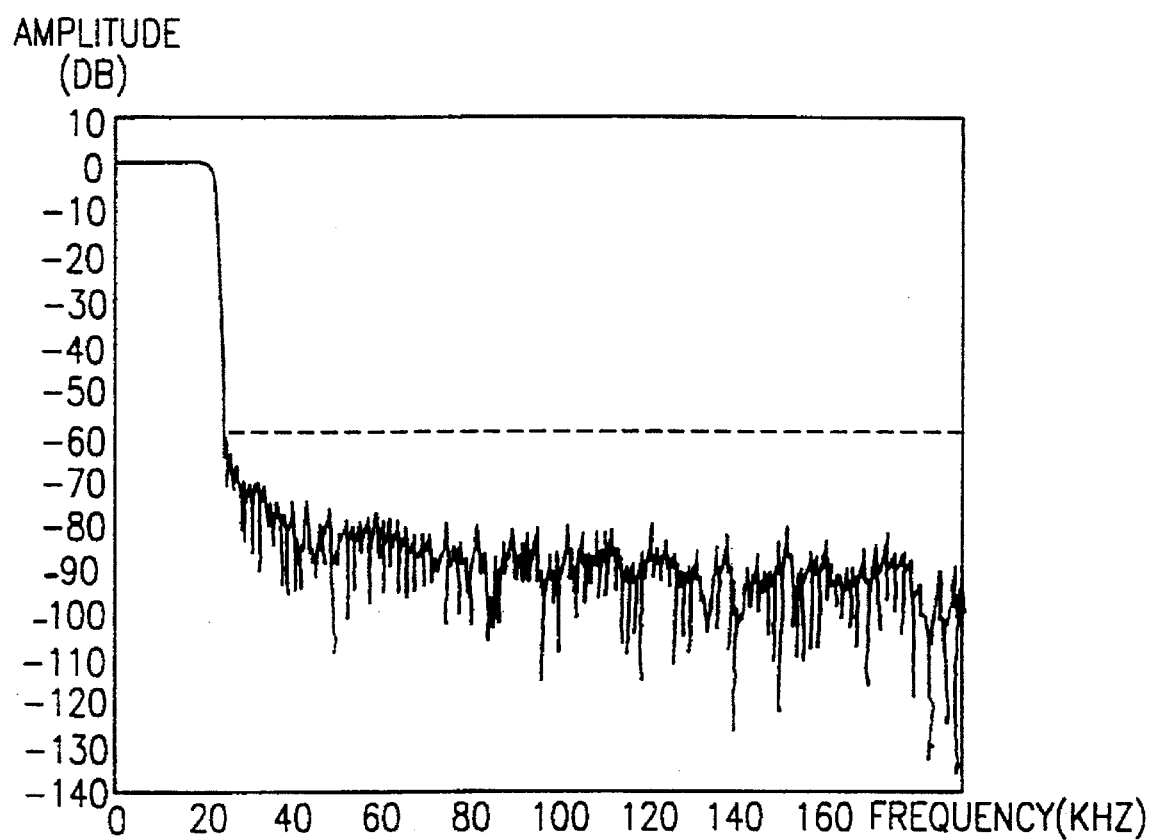
FIG. 4C is a characteristic graph of an eight-fold interpolation filter according to the present invention.

Thereafter, the multiplying and accumulating unit 59 outputs the convoluted data, so that the frequency components exceeding 20 Khz are filtered as shown in FIG. 4C.

As described above, the digital filter according to the present invention has simple control construction and smaller size. In addition, the present invention is directed to matrix-operate the filter coefficient stored in each ROM of the multi-digital filters and to store the operated result data to a ROM, so that the filtering operation is completed through one cycle convolution thereby achieving more speedy output data.

What is claimed is:

1. A digital filter, comprising:

a control unit for outputting a control signal;

an input buffer for buffering a data inputted in accordance with said control signal and for outputting the buffered data;

a data storing unit for storing a data outputted from said input buffer in accordance with a control signal applied thereto;

a ROM (Read Only Memory) having a filter coefficient stored therein, the filter coefficient being a matrix rearrangement of multi-stage coefficients, and having a zero coefficient;

an addressing unit for addressing an address of said filter coefficient stored in said ROM; and a multiplying and accumulating unit for convoluting the data outputted from said data storing unit and the ROM.

2. The filter of claim 1, wherein said data storing unit includes:

a multiplexer for selecting a data in accordance with a selection signal outputted from said control unit;

a RAM (Random Access Memory) for storing a data outputted from said multiplexer and for outputting the stored data to said multiplying and accumulating unit during a convolution operation in order; and a buffer for buffering the data outputted from the RAM in accordance with an enable signal outputted from the control unit and for outputting the buffered data to the multiplexer.

3. A digital filter, comprising:

a control unit for outputting a control signal;

an input buffer for buffering a data inputted in accordance with said control signal and for outputting the buffered data;

a data storing unit for storing a data outputted from said input buffer in accordance with a control signal applied thereto;

a ROM (Read Only Memory) storing a filter coefficient;

an addressing unit for addressing an address of said filter coefficient stored in said ROM; and a multiplying and accumulating unit for convoluting the data outputted from said data storing unit and the ROM, wherein said data storing unit includes:

a multiplexer for selecting a data in accordance with a selection signal outputted from said control unit;

a RAM (Random Access Memory) for storing a data outputted from said multiplexer and for outputting the stored data to said multiplying and accumulating unit during a convolution operation in order; and a buffer for buffering the data outputted from the RAM in accordance with an enable signal outputted from the control unit and for outputting the buffered data to the multiplexer.

* * * * *